(12) United States Patent
Yang et al.

(10) Patent No.: US 11,502,132 B2
(45) Date of Patent: Nov. 15, 2022

(54) SEMICONDUCTOR MEMORY DEVICE

(71) Applicant: SAMSUNG ELECTRONICS CO., LTD., Suwon-si (KR)

(72) Inventors: Jinwook Yang, Hwaseong-si (KR); Gyuhwan Oh, Hwaseong-si (KR); Junhwan Paik, Hwaseong-si (KR); Jiyoon Chung, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 10 days.

(21) Appl. No.: 17/158,287

(22) Filed: Jan. 26, 2021

(65) Prior Publication Data

US 2022/0020817 A1    Jan. 20, 2022

(30) Foreign Application Priority Data

Jul. 15, 2020  (KR) ................. 10-2020-0087495

(51) Int. Cl.
*H01L 27/24*   (2006.01)
*H01L 45/00*   (2006.01)

(52) U.S. Cl.
CPC ...... *H01L 27/2481* (2013.01); *H01L 27/2427* (2013.01); *H01L 45/06* (2013.01); *H01L 45/1233* (2013.01); *H01L 45/1253* (2013.01); *H01L 45/143* (2013.01); *H01L 45/144* (2013.01); *H01L 45/1675* (2013.01)

(58) Field of Classification Search
CPC .................................................. H01L 27/2481
See application file for complete search history.

(56) References Cited

U.S. PATENT DOCUMENTS

| | | | |
|---|---|---|---|
| 7,399,655 B2 | 7/2008 | Dennison | |
| 9,054,295 B2 | 6/2015 | Gotti et al. | |
| 10,535,819 B2 | 1/2020 | Kim et al. | |
| 11,309,490 B2* | 4/2022 | Wu | H01L 45/148 |
| 2005/0263829 A1 | 12/2005 | Song et al. | |
| 2018/0158869 A1* | 6/2018 | Chuang | H01L 43/08 |
| 2018/0366645 A1 | 12/2018 | Campbell et al. | |
| 2020/0066978 A1 | 2/2020 | Jeon et al. | |
| 2020/0091234 A1 | 3/2020 | Lee et al. | |
| 2020/0287129 A1* | 9/2020 | Sarkar | H01L 45/06 |
| 2021/0313397 A1* | 10/2021 | Lee | H01L 45/04 |

* cited by examiner

*Primary Examiner* — Mounir S Amer
(74) *Attorney, Agent, or Firm* — Lee IP Law, P.C.

(57) ABSTRACT

A semiconductor memory device including a substrate; a first conductive line on the substrate and extending in a first direction that is parallel to an upper surface of the substrate; a second conductive line extending in a second direction that intersects the first direction; a memory cell between the conductive lines and including a lower electrode pattern, a data storage element, an intermediate electrode pattern, a switching element, and an upper electrode pattern sequentially stacked on the first conductive line; and a sidewall spacer on a side surface of the memory cell, wherein the side surface of the memory cell includes a first concave portion at a side surface of the switching element, and the sidewall spacer includes a first portion on a side surface of the upper electrode pattern, and a second portion on the first concave portion, the second portion being thicker than the first portion.

20 Claims, 14 Drawing Sheets

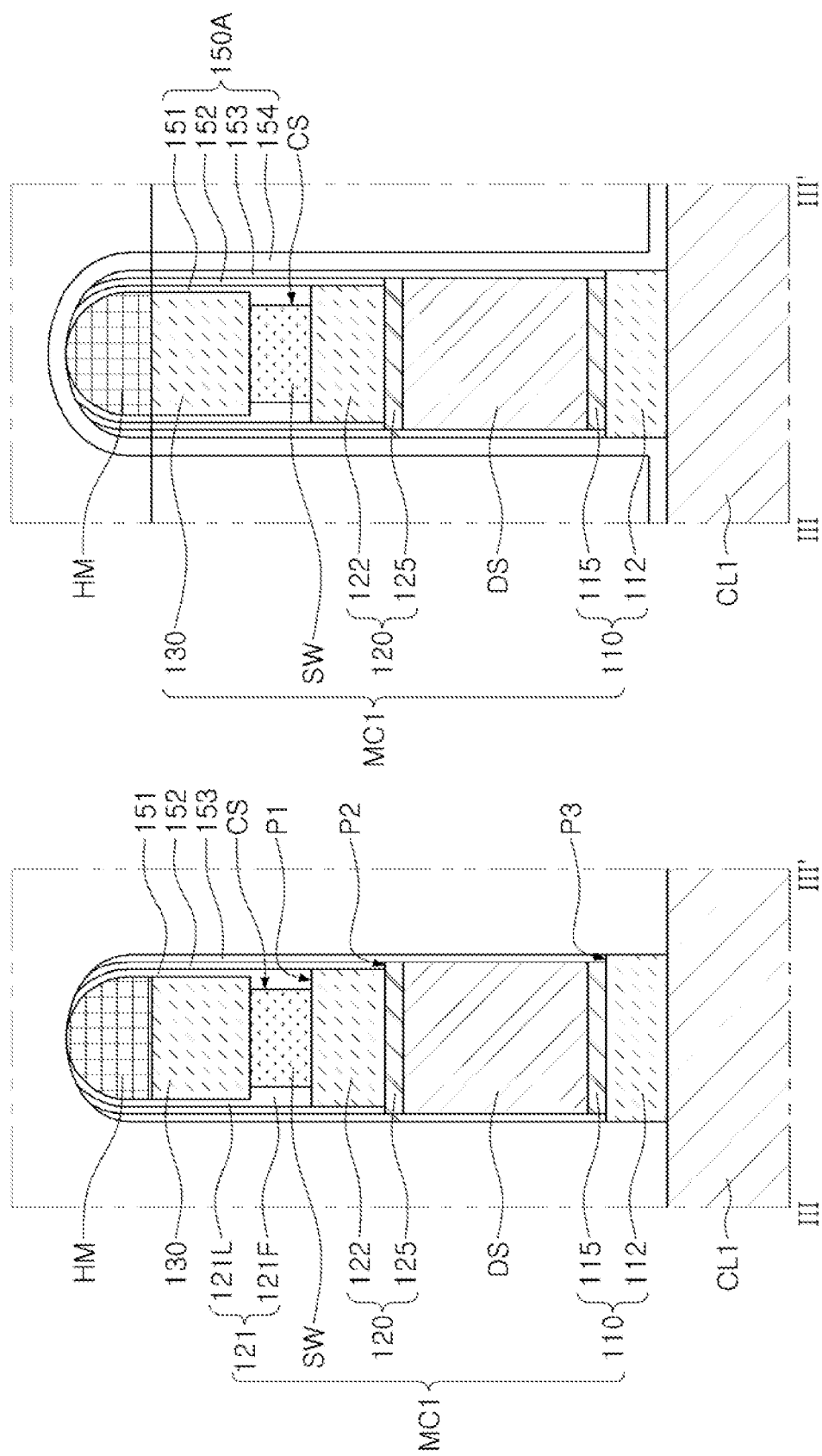

SEMICONDUCTOR MEMORY DEVICE

CROSS-REFERENCE TO RELATED APPLICATION

Korean Patent Application No. 10-2020-0087495, filed on Jul. 15, 2020, in the Korean Intellectual Property Office, and entitled: "Semiconductor Memory Device," is incorporated by reference herein in its entirety.

BACKGROUND

1. Field

Embodiments relate to a semiconductor memory device.

2. Description of the Related Art

In accordance with a trend for a semiconductor memory device, such as a memory device, to have high performance and low power consumption, next generation semiconductor memory devices, e.g., a magnetic random access memory (MRAM) and a phase-change random access memory (PRAM), have been developed. Such next generation semiconductor memory devices may employ a data storage material having a resistance value varying, depending on a current or voltage.

SUMMARY

The embodiments may be realized by providing a semiconductor memory device including a substrate; a first conductive line on the substrate and extending in a first direction, the first direction being parallel to an upper surface of the substrate; a second conductive line extending in a second direction, the second direction intersecting the first direction; a memory cell between the first and second conductive lines and including a lower electrode pattern, a data storage element, an intermediate electrode pattern, a switching element, and an upper electrode pattern sequentially stacked on the first conductive line; and a sidewall spacer on a side surface of the memory cell, wherein the side surface of the memory cell includes a first concave portion at a side surface of the switching element, and the sidewall spacer includes a first portion on a side surface of the upper electrode pattern, and a second portion on the first concave portion, the second portion being thicker in the first direction than the first portion.

The embodiments may be realized by providing a semiconductor memory device including a substrate; first conductive lines spaced apart from each other on the substrate; second conductive lines extending across the first conductive lines and spaced apart from each other; memory cells between the first and second conductive lines; sidewall spacers on side surfaces of the memory cells; and an interlayer insulating layer filling a space between the memory cells, wherein the memory cells include a lower electrode pattern, a data storage element, an intermediate electrode pattern, a switching element, and an upper electrode pattern sequentially stacked in a vertical direction perpendicular to an upper surface of the substrate, the upper electrode pattern has a first width in a horizontal direction parallel to the upper surface of the substrate, the switching element has a second width in the horizontal direction, the second width being smaller than the first width, and the sidewall spacer includes a first portion on a side surface of the upper electrode pattern, and a second portion on the side surface of the switching element, the second portion being thicker in the horizontal direction than the first portion.

The embodiments may be realized by providing a semiconductor memory device including a substrate; first conductive lines on the substrate and extending in a first direction, the first direction being parallel to an upper surface of the substrate; second conductive lines extending in a second direction, the second direction intersecting the first direction; memory cells between the first and second conductive lines and including a lower electrode pattern, a data storage element, an intermediate electrode pattern, a switching element, and an upper electrode pattern sequentially stacked on the first conductive lines; and sidewall spacers on side surfaces of the memory cells, wherein the memory cells include a first concave side surface at the switching element and a second concave side surface at the data storage element, and each of the sidewall spacers includes a first portion on the first concave side surface of the switching element, the first portion being thicker in a horizontal direction than a portion of the sidewall spacer on a side surface of the upper electrode pattern, and a second portion on the second concave side surface of the data storage element, the second portion being thicker in the horizontal direction than a portion of the sidewall spacer on a side surface of the intermediate electrode pattern.

BRIEF DESCRIPTION OF DRAWINGS

Features will be apparent to those of skill in the art by describing in detail exemplary embodiments with reference to the attached drawings in which:

FIGS. 4 to 15 are sectional views of stages in a method for manufacturing a semiconductor memory device according to an example embodiment;

DETAILED DESCRIPTION

Figure 1:
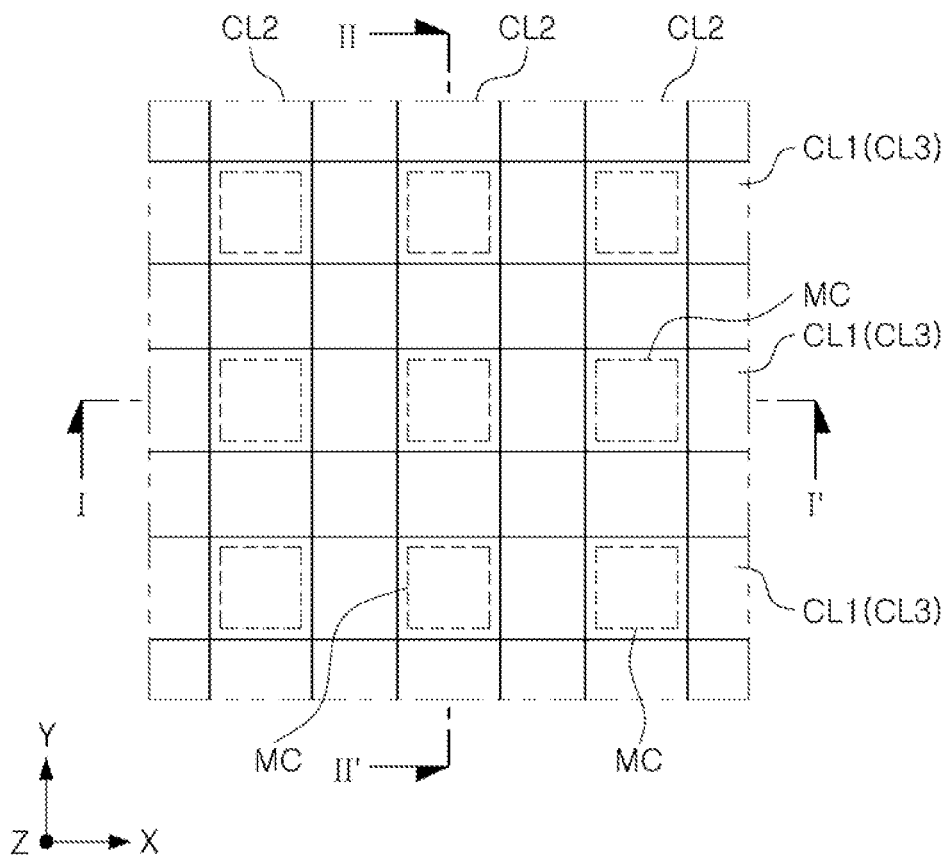
FIG. 1 is a plan view of a semiconductor memory device according to an example embodiment of the present disclosure.
Figure 2:
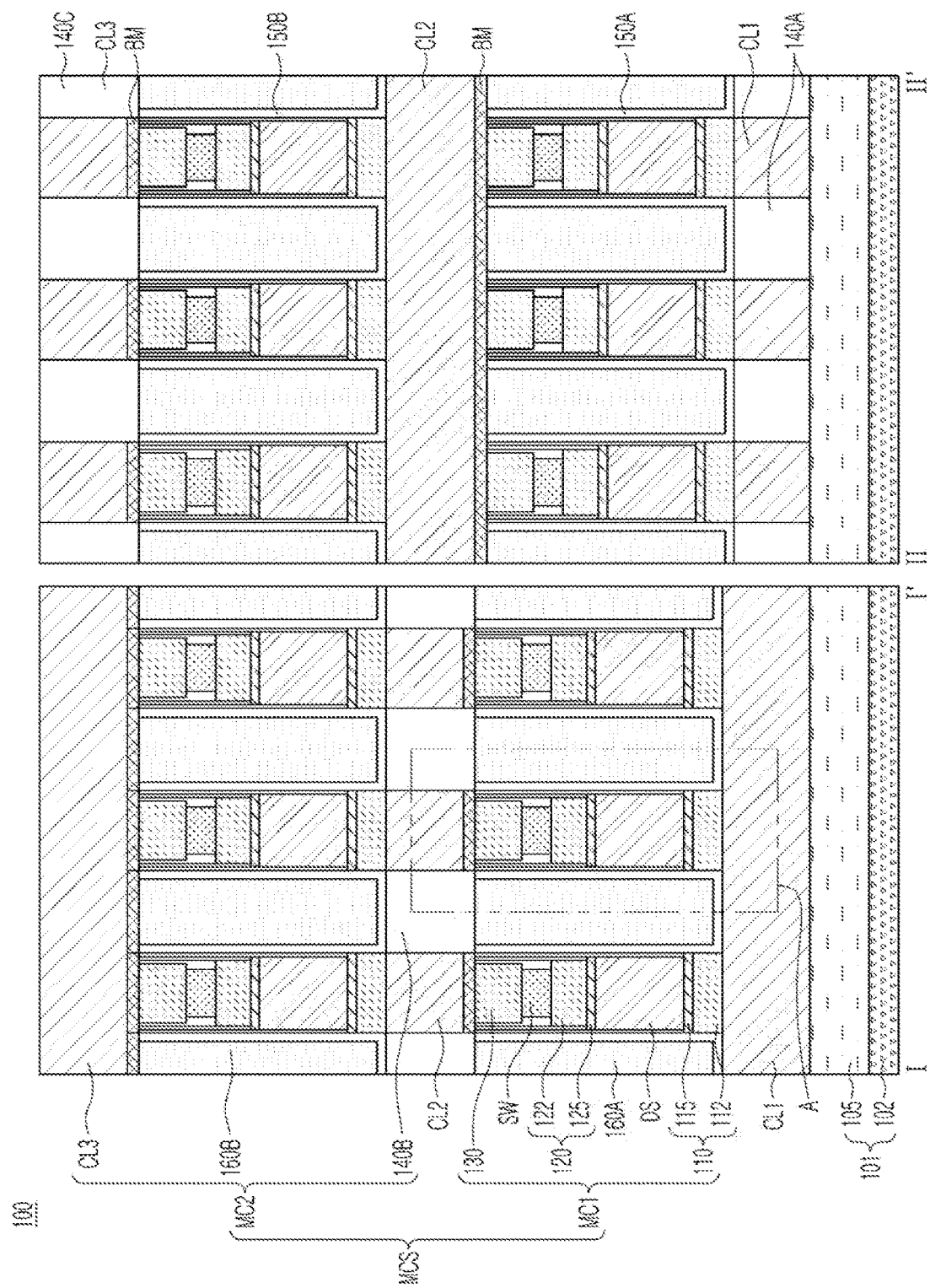
FIG. 2 is a cross-sectional view of the semiconductor memory device of FIG. 1 taken along lines I-I' and II-II'.

FIG. 1A is a plan view of a semiconductor memory device according to an example embodiment of the present disclosure, and FIG. 2 is a cross-sectional view illustrating the semiconductor memory device of FIG. 1 taken along lines I-I' and Referring to FIGS. 1 and 2, a semiconductor memory device 100 according to an example embodiment of the present disclosure may include a substrate 101 and a memory cell stacked body (MCS) on the substrate 101.

The memory cell stacked body (MCS) employed in the example embodiment may have a dual-layer structure including first memory cells MC1 and second memory cells MC2 and may include first to third conductive lines CL1 to CL3 and the first and second memory cells MC1 and MC2. The substrate 101 may include a semiconductor substrate 102 and a circuit region 105 on the semiconductor substrate 102. As used herein, the terms "first", "second", etc. are merely for identification, and are not intended to imply or require sequential inclusion of the elements.

The first conductive lines CL1 may be on the substrate 101. The first and third conductive lines CL1 and CL3 may extend (e.g., lengthwise) on the substrate 101 in a first direction (e.g., X direction) and may be spaced apart in a second direction (e.g., Y direction) intersecting the first direction (e.g., X direction). The second conductive lines CL2, between the first and third conductive lines CL1 and CL3, may extend (e.g., lengthwise) in the second direction and may be spaced apart in the first direction. The first memory cells MC1 may be between the first and second conductive lines CL1 and CL2, and similarly, the second memory cells MC2 may be between the second and third conductive lines CL2 and CL3. In an implementation, as illustrated in FIG. 1, the first and second memory cells MC1 and MC2 may be in a region in which the first and second conductive lines CL1 and CL2 intersect and in a region in which the second and third conductive lines CL2 and CL3 intersect.

The first and second memory cells MC1 and MC2 may include a data storage element DS and a switching element. The data storage element DS and the switching element SW may be on the first and second conductive lines CL1 and CL2 (e.g., the intersecting regions) in a third direction (e.g., Z direction) perpendicular to the (e.g., top surface of the) substrate 101. The first memory cells MC1 may include a lower electrode pattern 110 between the first conductive lines CL1 and the data storage element DS, an intermediate electrode pattern 120 between the data storage element DS and the switching element SW, and an upper electrode pattern 130 between the switching element SW and the second conductive lines CL2. Similarly, the second memory cells MC2 may include a lower electrode pattern 110 between the second conductive lines CL2 and the data storage element DS, an intermediate electrode pattern 120 between the data storage element DS and the switching element SW, and an upper electrode pattern 130 between the switching element SW and the third conductive lines CL3. A conductive barrier BM may be between the second and third conductive lines CL2 and CL3 and the first and second memory cells MC1 and MC2. In an implementation, the conductive barrier may include Ta, TaN, Mn, MnN, WN, Ti, TiN, or combinations thereof. As used herein, the term "or" is not an exclusive term, e.g., "A or B" would include A, B, or A and B.

In an implementation, the memory cell stacked body MCS may have a dual-layer structure including the first and second memory cells MC1 and MC2. In an implementation, the memory cell stacked body MCS may have a single layer structure or multiple layer (e.g., four-layer) structure.

The first and second memory cells MC1 and MC2 employed in the example embodiment may have a structure in which the switching element SW is on a higher level, as compared to the data storage element DS. In the specification, such a level may be defined on the basis of an upper surface of the substrate 101 (e.g., the switching element SW may be farther from the substrate 101 in the third direction than the data storage element DS is to the substrate 101 in the third direction).

The data storage element DS may contain a phase-changing memory material, capable of phase-changing from a crystalline state to a non-crystalline state or from a non-crystalline state to a crystalline state. In an implementation, the data storage element DS may contain a phase-change material, such as a chalcogenide material, or the like, which contains Ge, SB, or Te. In an implementation, the phase-change material of the data storage element DS may include a variable resistance material capable of storing data in a different manner.

In an implementation, the data storage element DS may include a binary composition, e.g., GeTe, GeSe, GeS, SbSe, SbTe, SbS, SbSe, SnSb, InSe, InSb, AsTe, AlTe, GaSb, AlSb, BiSb, ScSb, Ysb, CeSb, DySb, or NdSb, a ternary composition, e.g., GeSbSe, AlSbTe, AlSbSe, SiSbSe, SiSbTe, GeSeTe, InGeTe, GeSbTe, GeAsTe, SnSeTe, GeGaSe, BiSbSe, GaSeTe, InGeSb, GaSbSe, GaSbTe, InSbSe, InSbTe, SnSbSe, SnSbTe, ScSbTe, ScSbSe, ScSbS, YSbTe, YSbSe, YSbS, CeSbTe, CeSbSe, CeSbS, DySbTe, DySbSe, DySbS, NdSbTe, NdSbSe, or NdSbS, a quaternary composition, e.g., GeSbTeS, BiSbTeSe, AgInSbTe, GeSbSeTe, GeSnSbTe, SiGeSbTe, SiGeSbSe, SiGeSeTe, BiGeSeTe, BiSiGeSe, BiSiGeTe, GeSbTeBi, GeSbSeBi, GeSbSeIn, GeSbSeGa, GeSbSeAl, GeSbSeTl, GeSbSeSn, GeSbSeZn, GeSbTeIn, GeSbTeGa, GeSbTeAl, GeSbTeTl, GeSbTeSn, GeSbTeZn, ScGeSbTe, ScGeSbSe, ScGeSbS, YGeSbTe, YGeSbSe, YGeSbS, CeGeSbTe, CeGeSbSe, CeGeSbS, DyGeSbTe, DyGeSbSe, DyGeSbS, NdGeSbTe, NdGeSbSe, or NdGeSbS, or a quinary composition, e.g., InSbTeAsSe, GeScSbSeTe, GeSbSeTeS, GeScSbSeS, GeScSbTeS, GeScSeTeS, GeScSbSeP, GeScSbTeP, GeSbSeTeP, GeScSbSeIn, GeScSbSeGa, GeScSbSeAl, GeScSbSeTl, GeScSbSeZn, GeScSbSeSn, GeScSbTeIn, GeScSbTeGa, GeSbAsTeAl, GeScSbTeTl, GeScSbTeZn, GeScSbTeSn, GeSbSeTeIn, GeSbSeTeGa, GeSbSeTeAl, GeSbSeTeTl, GeSbSeTeZn, GeSbSeTeSn, GeSbSeSIn, GeSbSeSGa, GeSbSeSAl, GeSbSeSTl, GeSbSeSZn, GeSbSeSSn, GeSbTeSIn, GeSbTeSGa, GeSbTeSAl, GeSbTeSTl, GeSbTeSZn, GeSbTeSSn, GeSbSeInGa, GeSbSeInAl, GeSbSeInTl, GeSbSeInZn, GeSbSeZnSn, GeSbSeGaAl, GeSbSeGaTl, GeSbSeGaZn, GeSbSeGaSn, GeSbSeAlTl, GeSbSeAlZn, GeSbSeAlSn, GeSbSeTlZn, GeSbSeTlSn, or GeSbSeZnSn. In an implementation, the compositions may include, e.g., B, C, N, O, P, Cd, W, Ti, Hf, or Zr in a trace amount. In an implementation, the data storage element may have a multilayer structure including two or more layers having different compositions.

The switching element SW may contain a material having characteristics of a switching device. In an implementation, the switching element SW may include an ovonic threshold switching device (OTS). In an implementation, the switching element SW may contain a chalcogenide material, different from that of the data storage element DS. In an implementation, the switching element SW may contain a chalcogenide OTS, capable of maintaining a non-crystalline phase when a semiconductor device operates. In an implementation, the switching element SW may include an additional element (e.g., Si, N, or the like) capable of maintaining the non-crystalline phase at a higher temperature in an alloy material containing at least two of As, S, Se, The, and GE or alloys thereof.

In an implementation, the switching element SW may include a binary composition, e.g., GeSe, GeS, AsSe, AsTe, AsS SiTe, SiSe, SiS, GeAs, SiAs, SnSe, or SnTe, a ternary composition, e.g., GeAsTe, GeAsSe, AlAsTe, AlAsSe, SiAsSe, SiAsTe, GeSeTe, GeSeSb, GaAsSe, GaAsTe, InAsSe, InAsTe, SnAsSe, or SnAsTe, a quaternary composition, e.g., GeSiAsTe, GeSiAsSe, GeSiSeTe, GeSeTeSb, GeSiSeSb, GeSiTeSb, GeSeTeBi, GeSiSeBi, GeSiTeBi, GeAsSeSb, GeAsTeSb, GeAsTeBi, GeAsSeBi, GeAsSeIn, GeAsSeGa, GeAsSeAl, GeAsSeTl, GeAsSeSn, GeAsSeZn, GeAsTeIn, GeAsTeGa, GeAsTeAl, GeAsTeTl, GeAsTeSn, or GeAsTeZn, a quinary composition, e.g., GeSiAsSeTe, GeAsSeTeS, GeSiAsSeS, GeSiAsTeS, GeSiSeTeS, GeSiAsSeP, GeSiAsTeP, GeAsSeTeP, GeSiAsSeIn, GeAsSeGa, GeSiAsSeAl, GeSiAsSeTl, GeSiAsSeZn, GeSiAsSeSn, GeSiAsTeIn, GeSiAsTeGa, GeSiAsTeAl, GeSiAsTeTl, GeSiAsTeZn, GeSiAsTeSn, GeAsSeTeIn, GeAsSeTeGa, GeAsSeTeAl, GeAsSeTeTl, GeAsSeTeZn, GeAsSeTeSn, GeAsSeSIn, GeAsSeSGa, GeAsSeSAl, GeAsSeSTl, GeAsSeSZn, GeAsSeSSn, GeAsTeSIn, GeAsTeSGa, GeAsTeSAl, GeAsTeSTl, GeAsTeSZn, GeAsTeSSn, GeAsSeInGa, GeAsSeInAl, GeAsSeInTl, GeAsSeInZn, GeAsSeZnSn, GeAsSeGaAl, GeAsSeGaTl, GeAsSeGaZn, GeAsSeGaSn, GeAsSeAlTl, GeAsSeAlZn, GeAsSEAlSn, GeAsSeTlZn, GeAsSeTlSn, or GeAsSeZnSn, or a senary composition, e.g., GeSiAsSeTeS, GeSiAsSeTeIn, GeSiAsSeTeGa, GeSiAsSeTeAl, GeSiAsSeTeTl, GeSiAsSeTeZn, GeSiAsSeTeSn, GeSiAsSeTeP, GeSiAsSeSIn, GeSiAsSeSGa, GeSiAsSeSAl, GeSiAsSeSTl, GeSiAsSeSZn, GeSiAsSeSSn, GeAsSeTeSIn, GeAsSeTeSGa, GeAsSeTeSAl, GeAsSeTeSTl, GeAsSeTeSZn, GeAsSeTeSSn, GeAsSeTePIn, GeAsSeTePGa, GeAsSeTePAl, GeAsSeTePTl, GeAsSeTePZn, GeAsSeTePSn, GeSiAsSeInGa, GeSiAsSeInAl, GeSiAsSeInTl, GeSiAsSeInZn, GeSiAsSeInSn, GeSiAsSeGaAl, GeSiAsSeGaTl, GeSiAsSeGaZn, GeSiAsSeGaSn, GeSiAsSeAlSn, GeAsSeTeInGa, GeAsSeTeInAl, GeAsSeTeInTl, GeAsSeTeInZn, GeAsSeTeInSn, GeAsSeTeGaAl, GeAsSeTeGaTl, GeAsSeTeGaZn, GeAsSeTeGaSn, GeAsSeTeAlSn, GeAsSeSInGa, GeAsSeSInAl, GeAsSeSInTl, GeAsSeSInZn, GeAsSeSInSn, GeAsSeSGaAl, GeAsSeSGaTl, GeAsSeSGaZn, GeAsSeSGaSn, or GeAsSeSAlSn. In an implementation, the compositions may include B, C, N, or O in a trace amount. In an implementation, the switching element SW may have a multilayer structure, including at least two layers having different compositions.

In an implementation, the lower electrode pattern 110 may include a first lower electrode layer 112 on the first or second conductive lines CL1 or CL2 and the second lower electrode layer 115 on the first lower electrode layer 112. The first lower electrode layer 112 may be thicker (e.g., in the third direction) than the second lower electrode layer 115. In an implementation, the first lower electrode layer 112 may include a carbon-containing material, and the second lower electrode layer 115 may include tungsten (e.g., non-compounded tungsten) or a tungsten-containing compound. The carbon-containing material may include a carbon atom material or a conductive material containing a carbon atom and a metal element (e.g., W, Ti, Ta, or Co). In an implementation, the carbon- or metal-containing material may include a metal-carbon alloy material, such as tungsten carbide (WC) or titanium carbide (TiC). Hereinafter, the expression "carbon-containing material" may be understood as including not only a (e.g., pure) carbon atom material but also a conductive material containing carbon and a metal, as previously described.

The intermediate electrode pattern 120 may include a first intermediate electrode layer 125 on a side or top surface of the data storage element DS and a second intermediate electrode layer 122 on the first intermediate electrode layer 125. The second intermediate electrode layer 122 may be thicker (e.g., in the third direction) than the first intermediate electrode layer 125. In an implementation, the first intermediate electrode layer 125 may contain tungsten or a tungsten compound, and the second intermediate electrode layer 122 may include a carbon-containing material. In an implementation, the upper electrode pattern 130 on the switching element SW may include, e.g., a carbon-containing material.

First gap fill patterns 140A may be between the first conductive lines CL1. In an implementation, the first gap fill patterns 140A may include SiN, SiON, SiC, SiCN, SiOC, SiOCN, SiO$_2$, or Al$_2$O$_3$. The first gap fill patterns 140A may be formed using a process such as CVD, PVD, ALD, or SOG.

A first interlayer insulating layer 160A charging or filling a space between the first memory cells MC1 may be on the first conductive lines CL1 and the first gap fill patterns 140A. In an implementation, the first interlayer insulating layer 160A may include SiN, SiON, SiC, SiCN, SiOC, SiOCN, SiO$_2$, or Al$_2$O$_3$. The first interlayer insulating layer 160A may be formed using a process such as CVD, PVD, ALD, or SOG.

In an implementation, second gap fill patterns 140B may be between the second conductive lines CL2, and third gap fill patterns 140C may be between the third conductive lines CL3. A second interlayer insulating layer 160B filling a space between the second memory cells MC2 may be on the second conductive lines CL2 and the second gap fill patterns 140B. In an implementation, the second and third gap fill patterns 140B and 140C and the second interlayer insulating layer 160B may include an insulating material similar to the first gap fill patterns 140A and the first interlayer insulating layer 160A and may be formed using a similar process.

In an implementation, at least one of the first to third gap fill patterns 140A to 140C and the first and second interlayer insulating layers 160A and 160B may have a multilayer structure including at least two layers having different compositions.

First and second sidewall spacers 150A and 150B may be respectively on side surfaces of the first and second memory cells MC1 and MC2. In an implementation, the first sidewall spacer 150A may be between the first interlayer insulating layer 160A and the first memory cells MC1, and may extend toward or along a lower (e.g., substrate 101-facing) surface of the first interlayer insulating layer 160A and between the first conductive lines CL1 and the first gap fill patterns 140A as illustrated in FIG. 2. In an implementation, the second sidewall spacer 150B may be between the second interlayer insulating layer 160B and the second memory cells MC2 and may extend toward or along a lower surface of the second interlayer insulating layer 160B and between the second conductive lines CL2 and the second gap fill patterns 140B as illustrated in FIG. 2.

Figure 3:
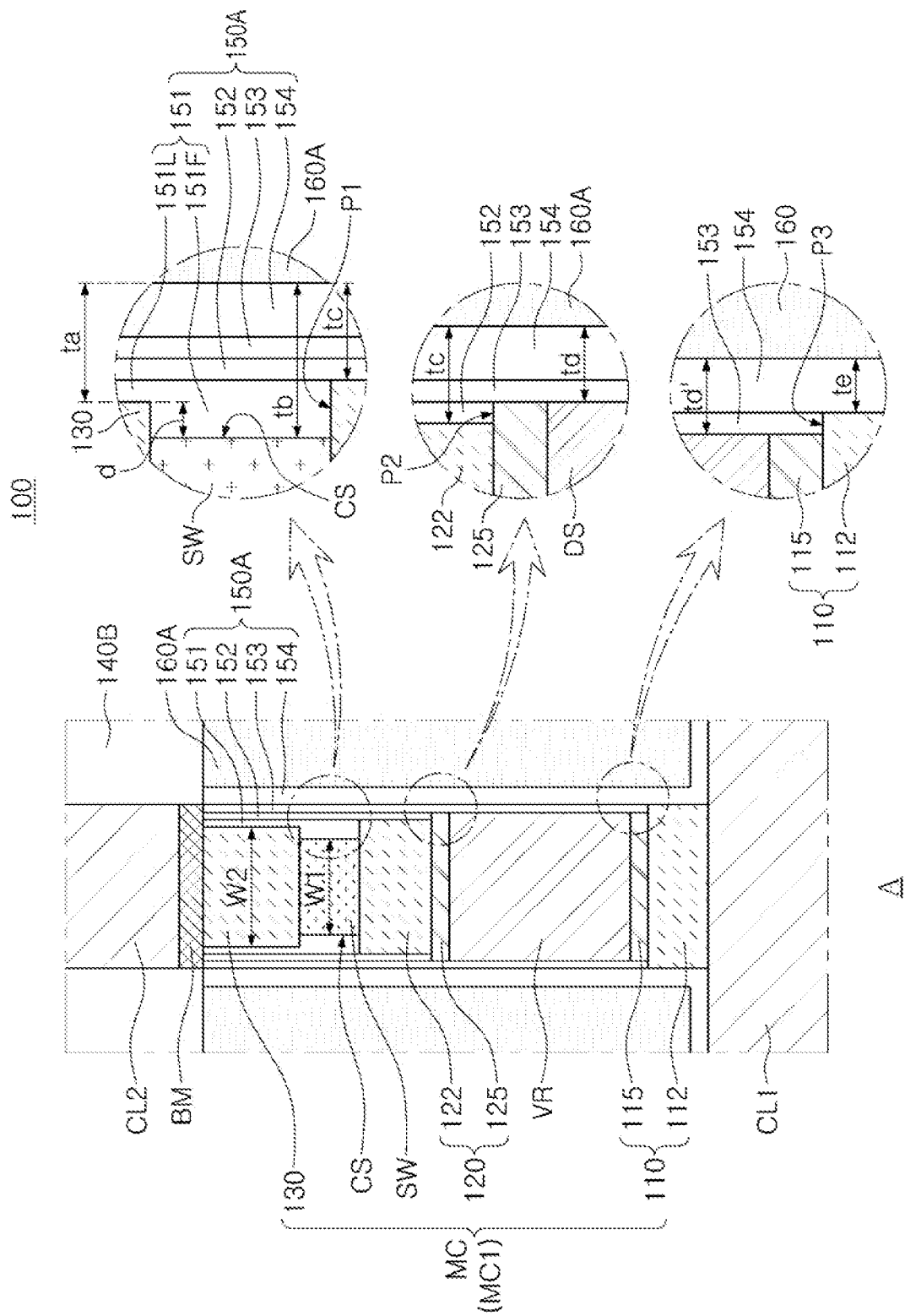
FIG. 3 is a partially enlarged view of a portion of FIG. 2.

The side surfaces of the first and second memory cells MC1 and MC2 may have a concave portion on a side surface of the switching element SW. As illustrated in FIG. 3, the switching element SW may have a width W1 (e.g., in the first direction) smaller than a width W2 of the upper electrode pattern 130. The side surface of the switching element SW may be drawn or recessed further inwardly, as compared to not only the side surface of the upper electrode pattern 130 but also that of the intermediate electrode pattern 120, thereby providing a concave side surface. In an implementation, a depth d (e.g., in the first direction) of the concave portion CS may be in the range of 0.5 nm to 3 nm, based on or as measured from the (e.g., outermost) side surface of the upper electrode pattern 130. In an implementation, the depth d of the concave portion CS may be in the range of 1 nm to 2 nm.

As illustrated in FIG. 3, in the first sidewall spacers 150A, a thickness ta (e.g., in the first direction) of a portion on or adjacent to the side surface of the upper electrode pattern 130 may be greater than a thickness te of a portion on the side surface of the lower electrode pattern 110. In an implementation, in the first sidewall spacer 150A, a thickness of a portion on the side surface of the intermediate electrode pattern 120 (e.g., the second intermediate electrode layer 122) may be greater than the thickness te of the portion on the side surface of the lower electrode pattern 110 (e.g., the first lower electrode layer 112) and smaller than the thickness ta of a portion on the side surface of the upper electrode pattern 130.

In an implementation, the first memory cells MC1 may have different thicknesses for each specific region according to a profile of each side thereof. In the first sidewall spacer 150A, a thickness tb of a portion on the side surface of the switching element SW may be greater than the thickness ta of the portion on the side surface of the upper electrode pattern 130. In an implementation, a first spacer film 151 may fill the concave portion CS and may cover the switching element SW with an insulating film having a sufficient thickness during a patterning process for a memory cell to protect the switching element SW from contamination due to an etching product (e.g., W) (see FIGS. 8 and 10).

In an implementation, as illustrated in FIG. 3, the first and second sidewall spacers 150A and 150B may have a structure including first to fourth spacer films 151 to 154.

In an implementation, an upper surface (e.g., surface facing away from the substrate 101 in the third direction) of the intermediate electrode pattern 120 may include a first perimeter area P1 in or on which the switching element SW is not located (e.g., surrounding an outer side of the switching element SW). Such a first perimeter area P1 may provide a tuck structure. A portion of the first sidewall spacer 150A, e.g., the first spacer film 151, may be on the first perimeter area P1 of the upper surface of the intermediate electrode pattern 120.

In an implementation, in the intermediate electrode pattern 120, an upper surface of the first intermediate electrode layer 125 may include a second perimeter area P2 in or on which the second intermediate electrode layer 122 is not located. Such a second perimeter area P2 may provide a tuck structure. A portion of the first sidewall spacer 150A, e.g., the second spacer film 152, may be on the second perimeter area P2 of the upper surface of the first intermediate electrode layer 125. In the first sidewall spacer 150A, the thickness tc of the portion on the side surface of the second intermediate electrode layer 122 may be greater than the thickness (e.g., td) of the portion on the side surface of the first intermediate electrode layer 125.

In an implementation, in the lower electrode pattern 110, an upper surface of the first lower electrode layer 112 may include a third perimeter area P3 on which the second lower electrode layer 115 is not located. Such a third perimeter area may provide a tuck structure. A portion of the first sidewall spacer 150A, e.g., the third spacer film 123, may be on the third perimeter area P3 of the upper surface of the first lower electrode layer 112. In the first sidewall spacer 150A, a thickness td' of a portion on the side surface of the second lower electrode layer 115 may be greater than the thickness to of a portion on the side surface of the first lower electrode layer 112.

In an implementation, the second lower electrode layer 115 and the first intermediate electrode layer 125 may be formed of a same material (e.g., tungsten (W)), and the thickness td' of the portion on the side surface of the second lower electrode layer 115 may be substantially the same as the thickness td of the portion on the side surface of the first intermediate electrode layer 125.

In an implementation, the first and second memory cells MC1 and MC2 may have various tuck structures formed using the patterning process, and accordingly, the sidewall spacer may have different thicknesses for or at each region.

Only the first sidewall spacer 150A is illustrated in FIG. 3, but the second sidewall spacer 150B may be understood as having a similar structure to the first sidewall spacer 150A illustrated in FIG. 3. The first to fourth spacer films 121 to 124 forming the first and second sidewall spacers 150A and 150B may contain an insulating material, e.g., SiN, SiO$_2$, SiON, SiBN, SiCN, SIOCN, Al$_2$O$_3$, AlN, or AlON. The first to fourth spacer films 121 to 124 may be formed using a process such as CVD, PVD, or ALD. In an implementation, at least one of the first to fourth spacer films 121 to 124 may be subject to a post-treatment process for film strengthening. In an implementation, such a post-treatment process may include plasma treatment of inactive gas such as N or He, Ar, heat treatment, or UV irradiation.

In an implementation as illustrated in FIG. 3, the first and second sidewall spacers 150A and 150B may include the first to fourth spacer films 151 to 154. In an implementation, the first and second sidewall spacers 150A and 150B may include various numbers of spacer films depending on a number of the patterning processes (see FIGS. 15A and 15B). In an implementation, boundaries of each of the spacer films 151 to 154 may not be recognized in a final product (e.g., TEM cross-sectional photographic image) depending on constitutional materials and processes of the spacer films and may be seen as a single sidewall spacer structure.

As previously described, the first and second sidewall spacers 150A and 150B may extend toward or around a lower surface of the first interlayer insulating layer 160A and between the first conductive lines CL1 and the first gap fill patterns 140A. In an implementation, such extended portion may be provided by, e.g., may be a part of, the fourth spacer film 154.

Figure 15:
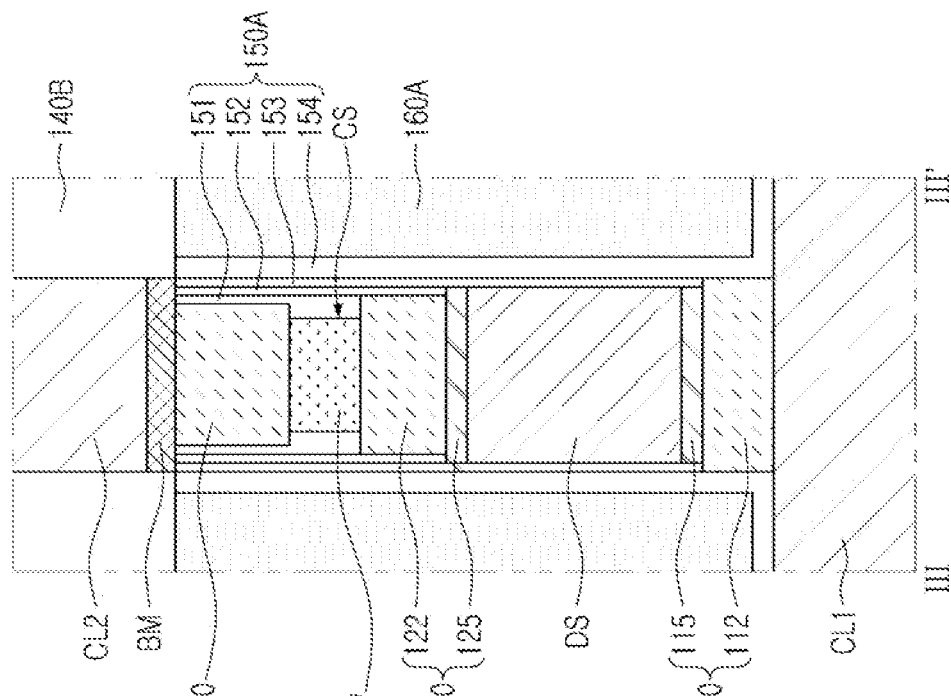
Figure 16A:
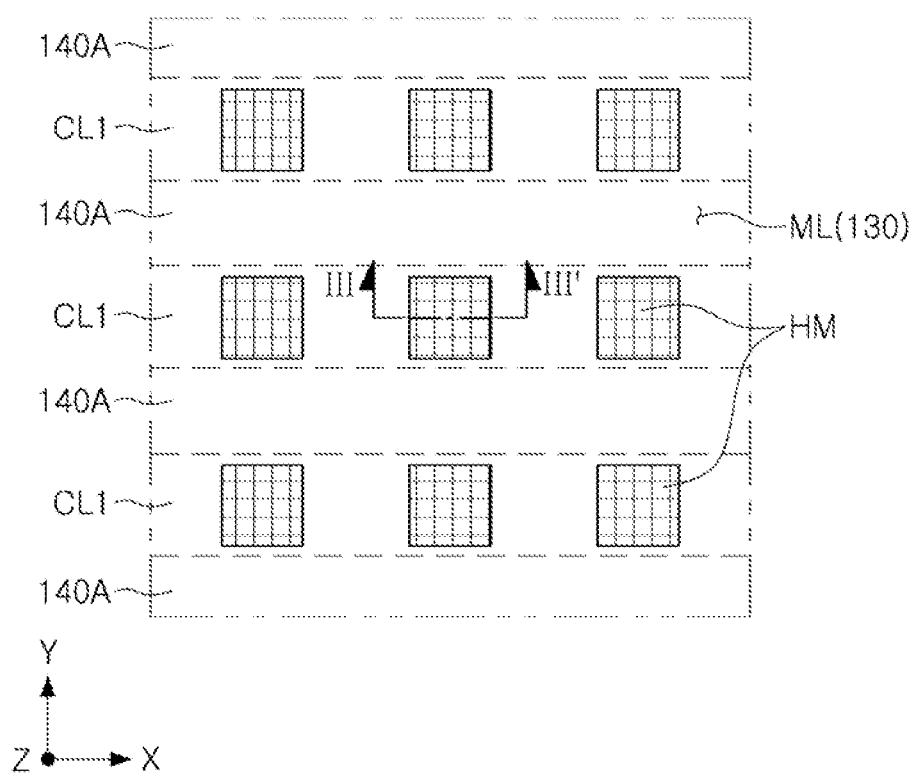
FIGS. 16A and 16B are plan views of a semiconductor memory device based on the cross-sections of FIGS. 4 to 15.
Figure 16B:
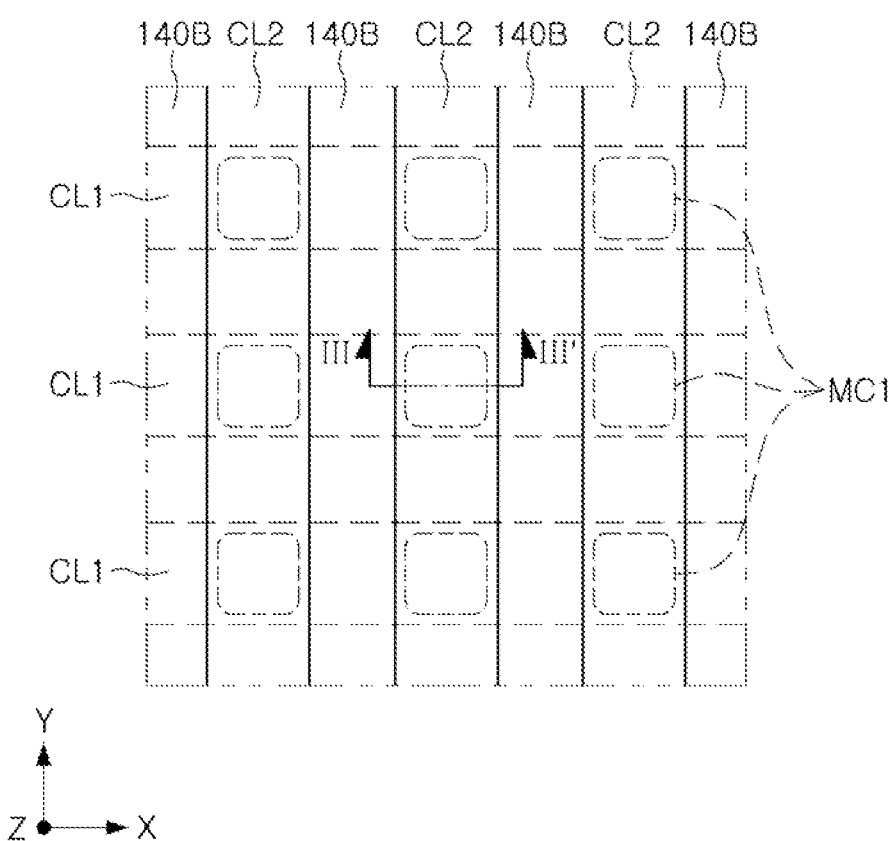

FIGS. 4 to 15 are sectional views of stages in a method for manufacturing a semiconductor memory device according to an exemplary embodiment, and FIGS. 16A and 16B are plan views of a semiconductor memory device based on the cross-sections of FIGS. 4 to 15. The cross-sectional view of each process illustrates the portion extended to a portion of the substrate in "A" of the semiconductor memory device illustrated FIG. 2, as illustrated in FIG. 3.

Figure 4:
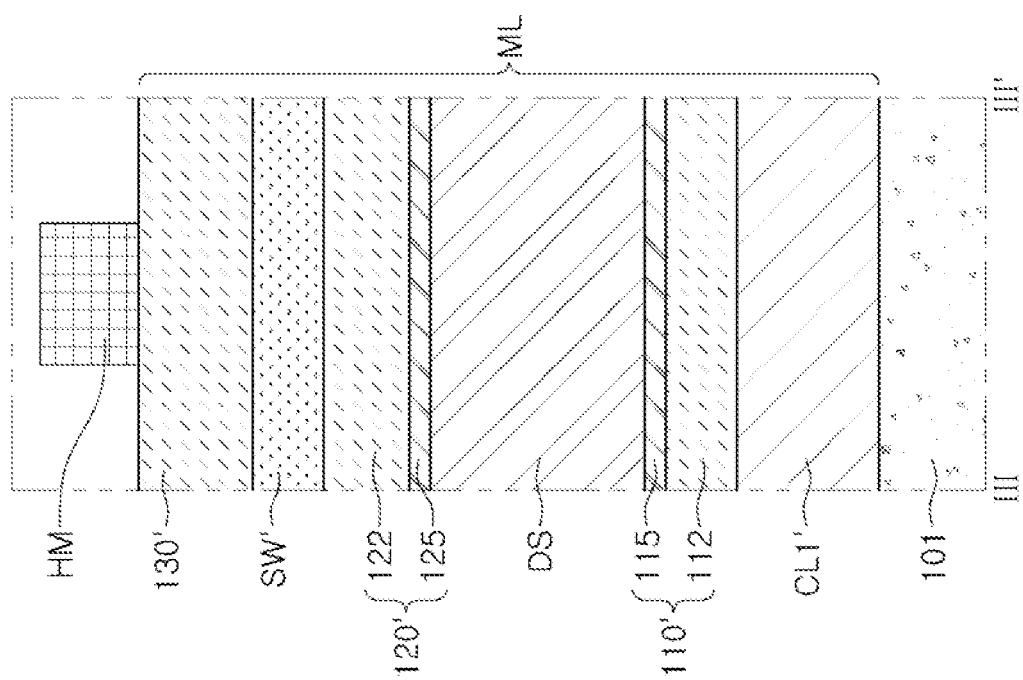

Referring to FIGS. 4 and 16A, a stacked body ML may be formed for the first memory cells MC1 on the first conductive lines CL1 and the gap fill pattern 140A, and a plurality of mask patterns HM may be formed for the first memory cells MC.

Before the stacked body ML is formed, a conductive layer on the substrate M may be partially etched to form the first conductive lines CL1 extending in the first direction (e.g., X direction) and spaced apart in the second direction (e.g., Y direction), and a first gap fill pattern 140A may be formed between the first conductive lines CL1 (see FIG. 2).

A lower electrode layer 110', a data storage element DS', an intermediate electrode layer 120', a switching material layer SW', and an upper electrode layer 130' may be stacked on the first conductive lines CL1 and the first gap fill pattern 140A to form the stacked body ML for the first memory cells MC1. In an implementation, the lower electrode layer 110' may include a first lower electrode layer 112 including a carbon-containing material and a second lower electrode layer 115 including tungsten or a tungsten compound. In an implementation, the intermediate electrode layer 120' may include a first intermediate electrode layer including tungsten or a tungsten compound and a second intermediate electrode layer 122 on the first intermediate electrode layer 125 and including a carbon-containing material.

A plurality of mask patterns HM employed in the example embodiment may define a region for the first memory cells as illustrated in FIG. 16A and may be arranged in a certain interval. In an implementation, the mask patterns HM may be spaced apart in the first direction (e.g., X direction) in a region overlapping the first conductive lines. In an implementation, a mask pattern may have a line shape. In this case, the stacked body ML may be first etched as a first line pattern spaced apart in the second direction (e.g., Y direction) while extending (e.g., lengthwise) in the first direction (e.g., X direction), and the first etched stacked body may be second etched as a second line pattern spaced apart in the first direction (e.g., X direction) while extending in the second direction (e.g., Y direction) to form desired first memory cells. The second etching may be performed after conductive layers for the second conductive lines are formed.

Figure 5:
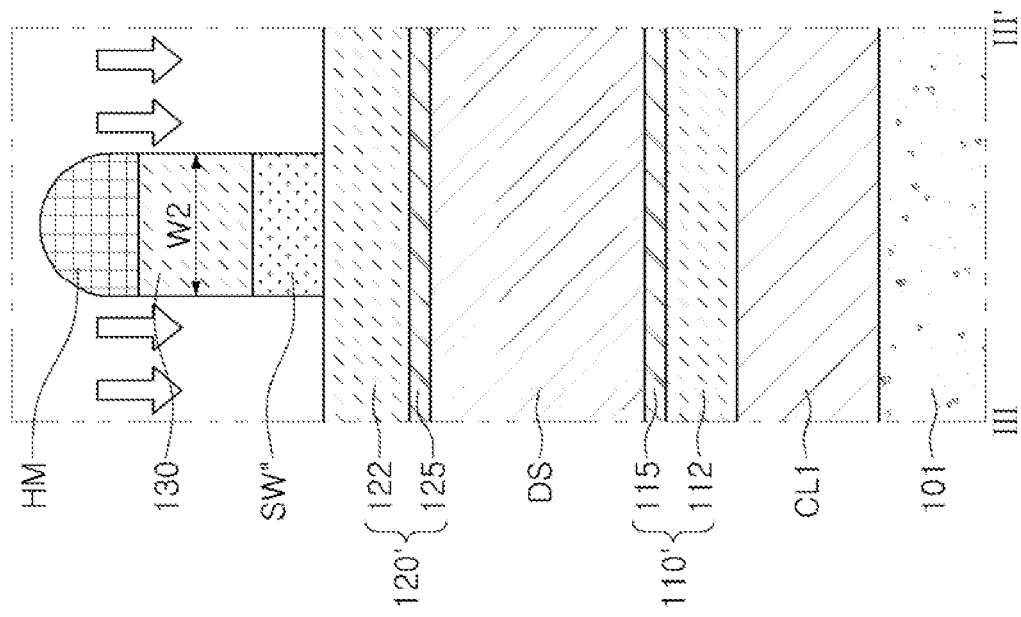

As illustrated in FIG. 5, an upper electrode layer 130' and a switching material layer SW' may be etched using the mask pattern HM to form an upper electrode pattern 130 and a switching element SW.

In the process, the upper electrode layer 130' and the switching material layer SW' may be sequentially etched by etching processes using different etchants. In the etching process of the switching material layer SW', the second intermediate electrode layer 122 may function as an etching stop. The etching processes may be performed using dry etching. As a result, an upper surface of the second intermediate electrode layer 122 located around the switching element SW may be exposed. During such process, an upper surface of the mask pattern may be partially etched and may thus have a convex shape. In this process, the upper electrode pattern 130 and the switching element SW may use a same mask and may thus have side surfaces that are substantially coplanar.

Figure 6:
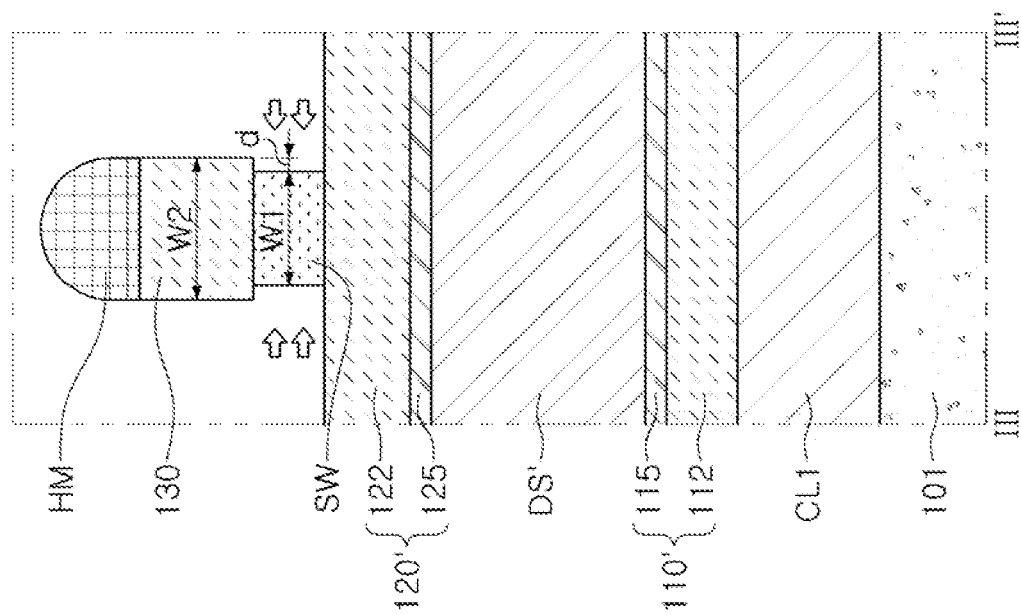

In an implementation, as illustrated in FIG. 6, a side surface of the switching element SW may be further etched.

An additional etching process may be performed for the side surface of the switching element SW. The additional side surface etching may be performed using wet etching. As a result, the switching element SW may have a width W1 that is smaller than a width W2 of the upper electrode pattern 130. The side surface CS of the switching element SW may be drawn or recessed further inwardly, as compared to the side surface of the upper electrode pattern 130. In an implementation, a depth of the side surface CS of the switching element SW drawn inwardly may be in the range of 0.5 nm to 3 nm, as measured inwardly from the (e.g., outer) side surface of the upper electrode pattern 130. In an implementation, the depth may be in the range of 1 nm to 2 nm.

Figure 7:
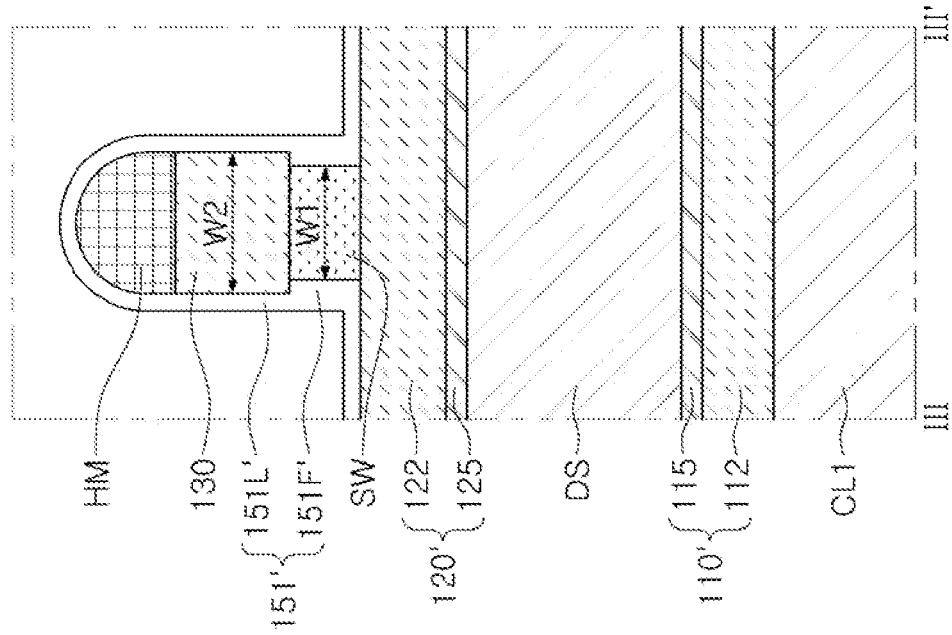

As illustrated in FIG. 7, a first spacer film 151' may be formed.

The first spacer film 151' may be formed relatively conformally along a surface of the mask pattern HM and side surfaces of the upper electrode pattern 130 (e.g., as a thinner portion 151L'), the switching element SW (e.g., as a thicker portion 151F'), and an exposed upper surface of the second intermediate electrode layer 122'. The first spacer film 151' may be formed on the side surface CS of the switching element SW drawn further inwardly as compared to the side surface of the upper electrode pattern 130. As a result, the portion of the first spacer film on the side surface CS of the switching element SW in the finally-prepared device may have the thickness tb that is greater than the thickness to of the portion on the side surface of the upper electrode pattern 130. The first spacer film having the thickness tb may help effectively prevent the switching element SW from being contaminated in subsequent processes.

Figure 8:
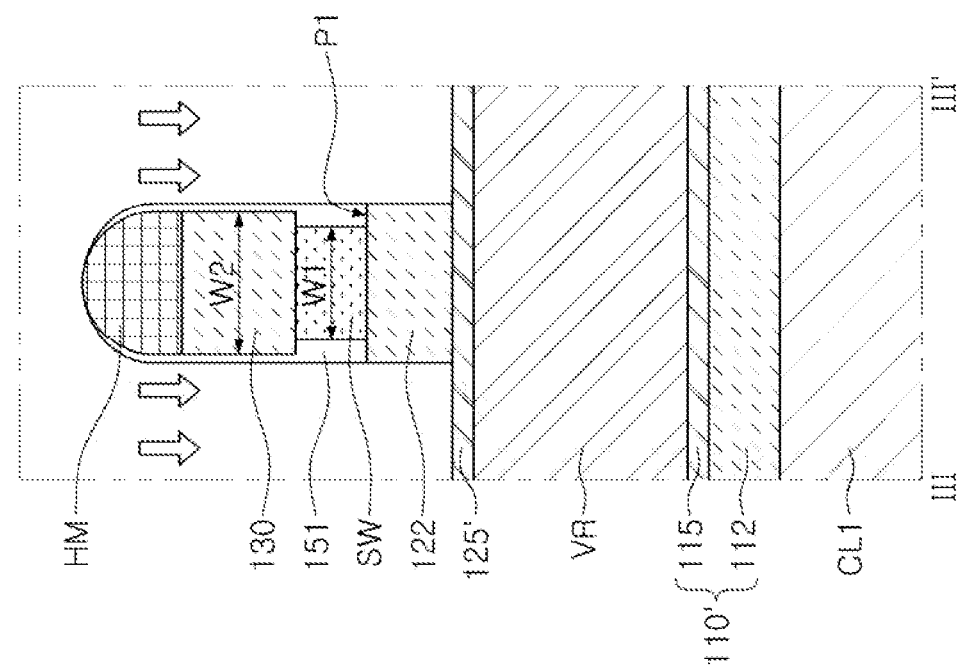

As illustrated in FIG. 8, the first spacer film 151 may be used (e.g., as a mask) to etch the second intermediate electrode layer 122'.

The etching of the second intermediate electrode layer 122' may be performed using an anisotropy etching process using the first intermediate electrode layer 125' as an etching stop. As a result of the etching, the first spacer film 151 located on a side surface of the etched stack portion may remain to have a smaller thickness. The remaining first spacer film 151 may be on the first perimeter area P1 of the upper surface of the second intermediate electrode layer 122.

Figure 9:
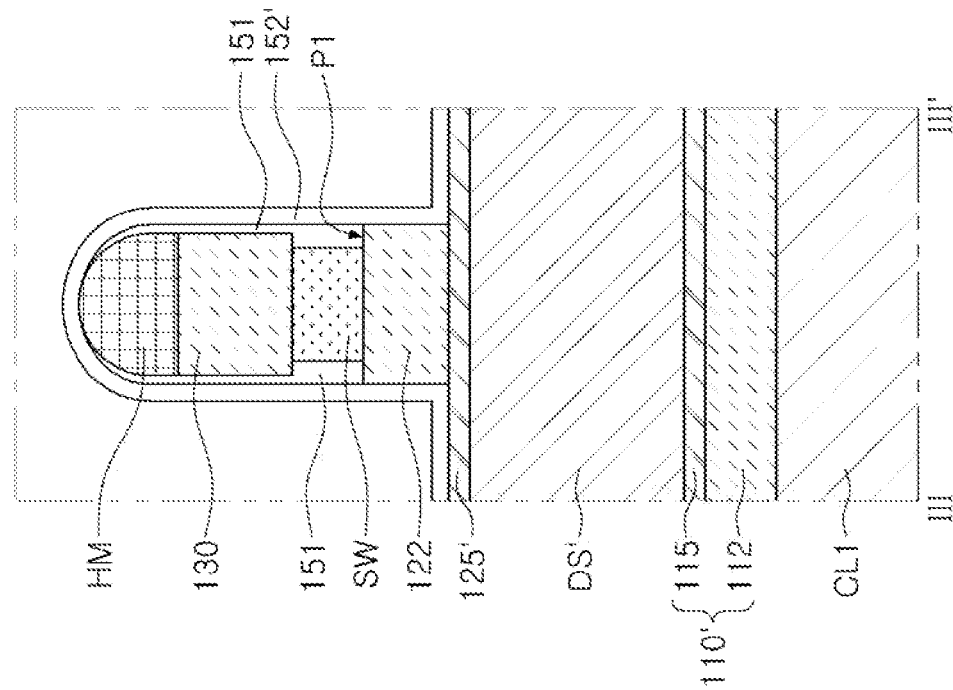
Figure 10:
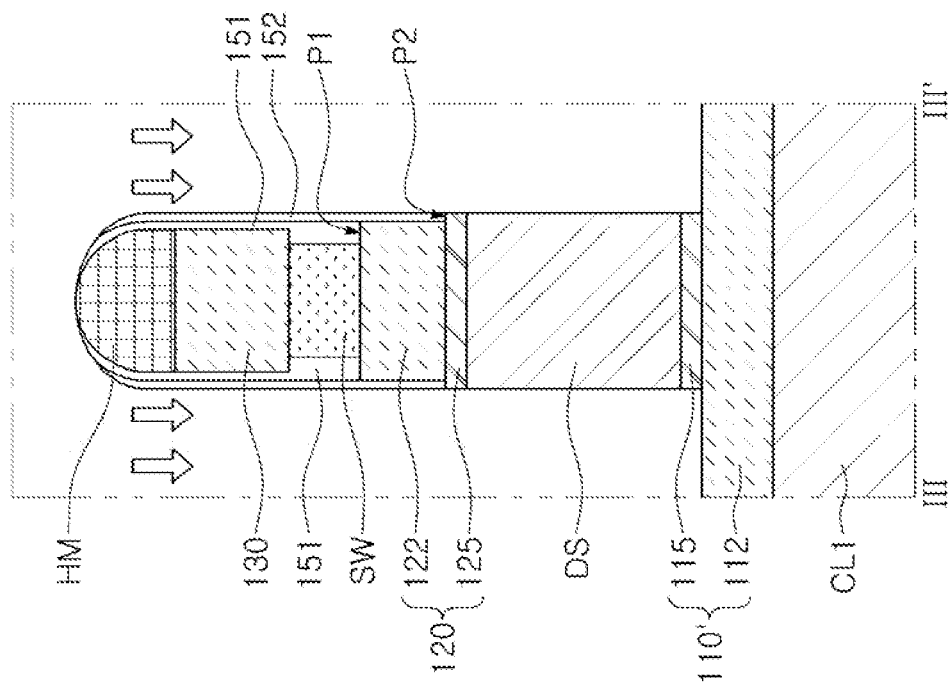

A second spacer film 152' may be formed as illustrated in FIG. 9, and the second spacer film 152' may be used to etch the first intermediate electrode layer 125', the data storage material layer DS' and the second lower electrode layer 115 as illustrated in FIG. 10.

The second spacer film 152' may be formed relatively conformally along a surface of the mask pattern HM, a surface of the first spacer film 151 and an exposed upper surface of the first intermediate electrode layer 125'. In an implementation, the first intermediate electrode layer 125' and the second lower electrode layer 115 may be formed of a same or similar conductive material. In an implementation, the first intermediate electrode layer 125' and the second lower electrode layer 115 may contain tungsten or a tungsten compound. The etching may be performed using an anisotropy etching process using the first lower electrode layer 112 as an etching stop. As a result of the etching, the second spacer film 152 on the surface of the first spacer film 151 may remain to have a smaller thickness. The remaining second spacer film 152 may be on the second perimeter area P2 of the upper surface of the first intermediate electrode layer 125.

Figure 11:
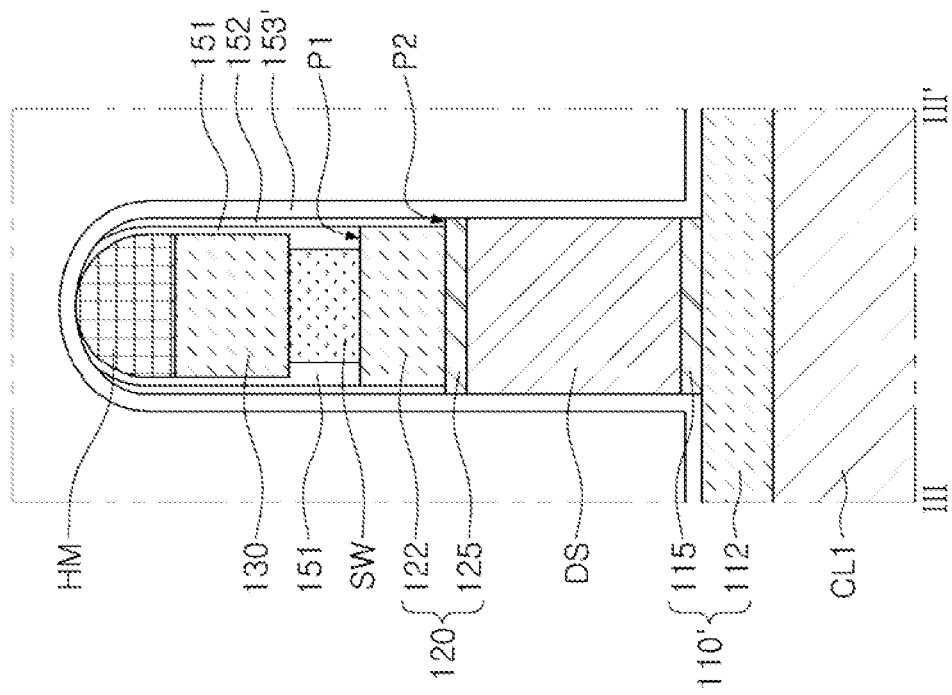

A third spacer film 153' may be formed as illustrated in FIG. 11, and the third spacer film 153' may be used to etch the first lower electrode layer 112 as illustrated in FIG. 12.

The third spacer film 153' may be formed relatively conformally along a surface of the mask pattern HM, a surface of the second spacer film 152, and an exposed upper surface of the first lower electrode layer 112. As a result of the etching, the third spacer film 153 on the surface of the second spacer film 152 may remain to have a smaller thickness. The remaining third spacer film 153 may be on the third perimeter area P3 of the upper surface of the first lower electrode layer 112.

As illustrated in FIG. 13, the fourth spacer film 154 may be formed on the remaining third spacer film 153.

The fourth spacer film 154, together with the first to third spacer films 151 to 153, may be provided as sidewall spacers 150A. The fourth spacer film 154 may extend between the first conductive lines CL1 and the first gap fill patterns 140A. A different numbers of spacer films may be included depending on a number of the patterning processes (see FIGS. 15A and 15B). Boundaries of each of the spacer films 151 to 154 may not be recognized and may be shown as a single sidewall spacer structure.

Figure 14:
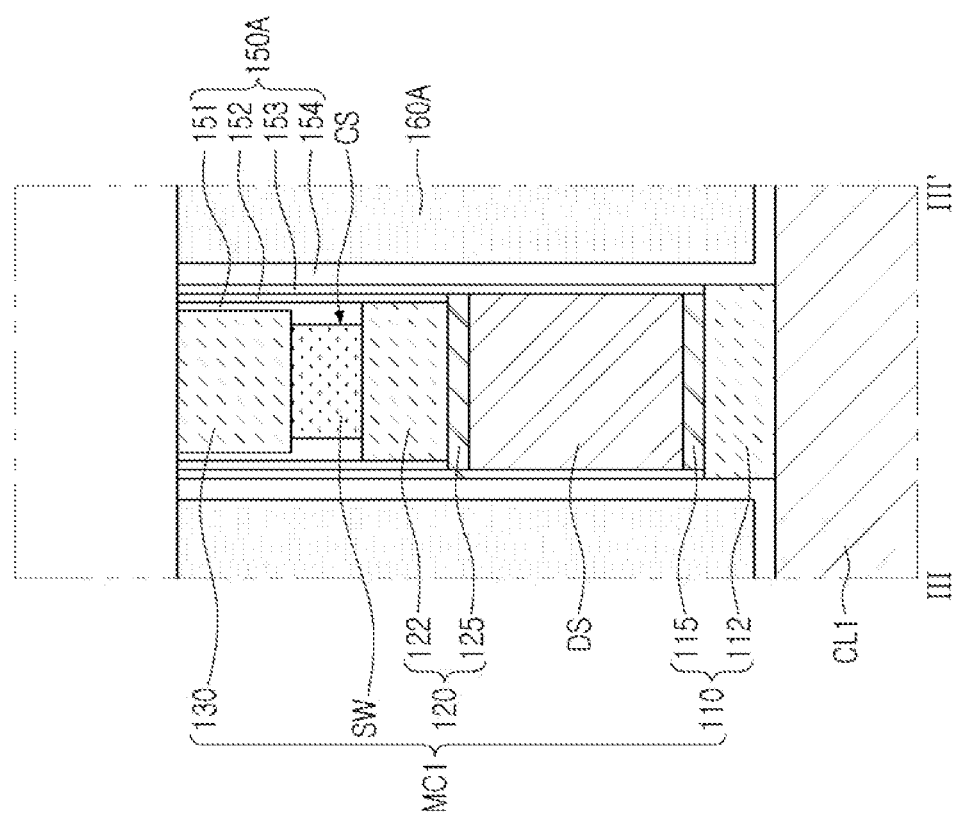

As illustrated in FIG. 14, the mask pattern HM may be be removed by employing a polishing process after a first interlayer insulating layer 160A is formed.

In the process, the first interlayer insulating layer 160A may be formed to cover first memory cells while filling a space between the first memory cells. In an implementation, the first interlayer insulating layer 160A may be formed using a flowable chemical vapor deposition (FCVD) process or a spin coating process. In an implementation, the first interlayer insulating layer 160A may include a low-dielectric insulating material, such as an oxide, a nitride, and/or a oxynitride. In the polishing process, the first interlayer insulating layer 160A may be polished until the mask pattern HM is removed and an upper surface of the upper electrode pattern 130 is exposed.

Referring to FIGS. 15 and 16B, second conductive lines CL2 may be formed on first memory cells MC1 and a first interlayer insulating layer 160A.

A conductive layer for a barrier metal layer BM and the second conductive lines CL2 may be partially etched on a polished surface. The etching process may be performed to form the second conductive lines CL2 extending in the second direction (e.g., Y direction) and spaced apart in the first direction (e.g., X direction).

Similarly to the previous processes (FIG. 4), a second gap fill pattern 140B may be formed between the second conductive lines CL2, and desired second memory cells MC2 and third conductive lines CL3 may be formed by repeatedly performing the previously described memory cell-forming process (FIGS. 4 to 14) and conductive line-forming process (FIG. 14) (see FIG. 2).

The memory cells may have various tuck structures depending on patterning processes and may have different thicknesses of sidewall spacers for each region. Various example embodiments according to such patterning processes are illustrated in FIGS. 17A and 17B.

Figure 17A:
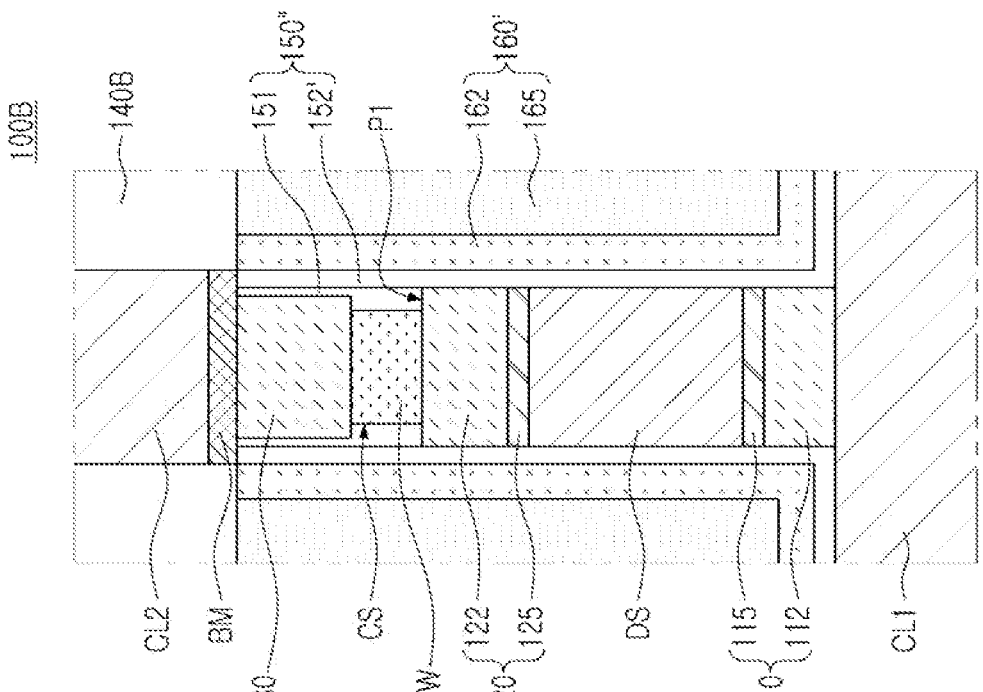
FIGS. 17A and 17B are cross-sectional views of a semiconductor memory device according to various example embodiments.
Figure 17B:
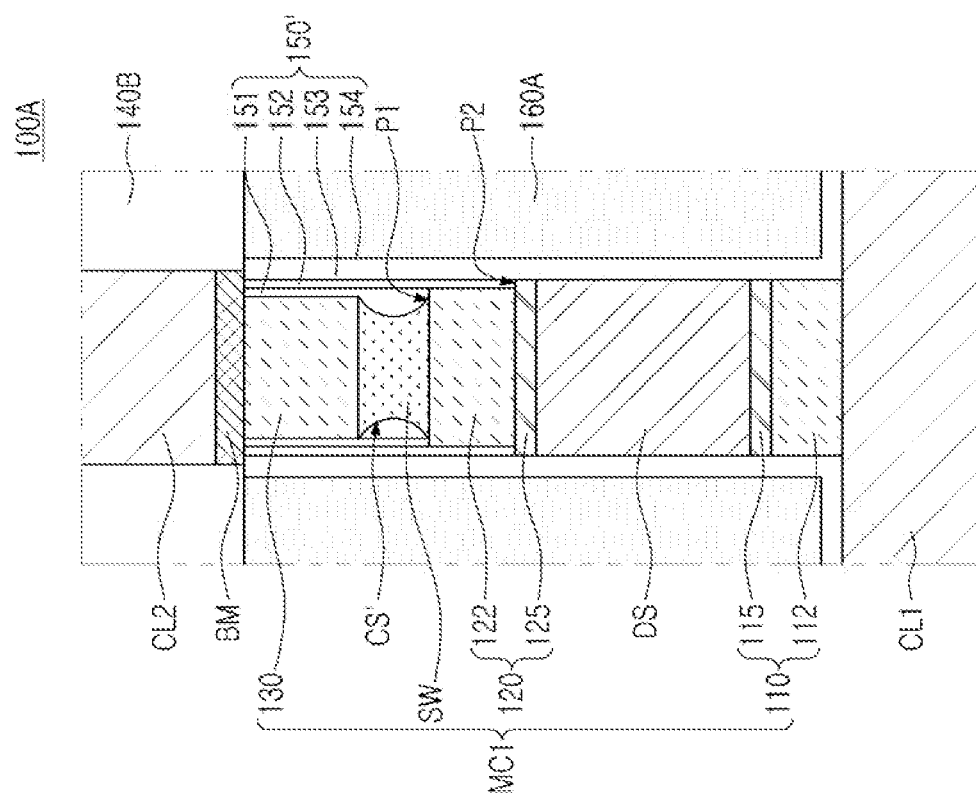

FIGS. 17A and 17B are cross-sectional views of a semiconductor memory device according to various exemplary embodiments.

Referring to FIG. 17A, a semiconductor memory device 100A according to the example embodiment may be understood as being similar to the semiconductor memory device 100 illustrated in FIGS. 1 to 3 except in having a double tuck structure and a side surface CS' of a switching element SW may be formed to be concavely recessed (e.g., an inwardly curved shape). Further, unless otherwise indicated, the semiconductor memory device 100A may be understood based on the same or similar elements of the semiconductor memory device 100 illustrated in FIGS. 1 to 3.

The semiconductor memory device 100A according to the example embodiment may have the concavely recessed side surface CS' of the switching element SW, and a portion of a sidewall spacer 150', on the side surface CS' of the switching element SW may have a greater thickness than a portion on a sides surface of the upper electrode pattern 130. In the previous example embodiment (see FIG. 3), the side surface CS of the switching element SW may be entirely recessed further inwardly than the side surface of the upper electrode pattern 130. In contrast, the side surface CS' of the switching element SW of the present embodiment may have a concave shape, which may be more recessed inwardly than a central portion.

The semiconductor memory device 100A, contrary to that in the previous example embodiments, may have a sidewall spacer 150' including first to third spacer films 151 to 153, and a memory cell MC may have a double tuck structure. An upper surface of the intermediate electrode pattern 120 may include a first perimeter region P1 on which the switching element SW is not located, and a portion of the sidewall spacer 150', e.g., the first spacer film 151, may be on the first perimeter region P1 of the upper surface of the intermediate electrode pattern.

The intermediate electrode pattern 120 of the present embodiment may include a first intermediate electrode layer 125 on the data storage element DS and a second intermediate electrode layer 122 on the first intermediate electrode layer 125. An upper surface of the first intermediate electrode layer 125 may include a second perimeter region P2 on which the second intermediate electrode layer 122 is not located. A portion of the sidewall spacer 150', e.g., the second spacer film 152, may be on the second perimeter region P2 of the upper surface of the first intermediate electrode layer 125.

In an implementation, the first intermediate electrode layer 125, the data storage element DS, and a lower electrode pattern 110 may be etched to a region adjacent to first conductive lines CL1 in a single etching process. The third spacer film 153, together with the second spacer film 152, may be formed on side surfaces of the lower electrode pattern 110, the first intermediate electrode layer 125 and the data storage element DS and may provide a single sidewall spacer 150'.

Referring to FIG. 17B, a semiconductor memory device 100B according to the example embodiment may be understood as being similar to the semiconductor memory device 100 illustrated in FIGS. 1 to 3 except in having a single tuck structure and an interlayer insulating layer configured as a double material layer. Further, unless otherwise indicated, the semiconductor memory device 100B may be understood based on the same or similar elements of the semiconductor memory device 100 illustrated in FIGS. 1 to 3.

The semiconductor memory device 100B according to the present embodiment may have a side surface CS of the switching element SW, which is recessed further inwardly, as compared to a side surface of an upper electrode pattern 130, and a portion of a sidewall spacer 150", on the side surface CS of the switching element SW, may have a greater thickness than a portion on a sides surface of the upper electrode pattern 130.

The semiconductor memory device 100B, contrary to that in the previous example embodiments, may have the sidewall spacer 150" including first and second spacer films 151 and 152, and a memory cell MC may have a single tuck structure. An upper surface of the intermediate electrode pattern 120 may include a first perimeter region P1 on which the switching element SW is not located, and a portion of the sidewall spacer 150", e.g., the first spacer film 151, may be on the first perimeter region P1 of the upper surface of the intermediate electrode pattern 120.

In an implementation, the intermediate electrode pattern 120, the data storage element DS, and a lower electrode pattern 110 may be etched to a region adjacent to first conductive lines CL1 by a single etching process. The second spacer film 152, together with the first spacer film 151, may be formed on side surfaces of the lower electrode pattern 110, and the second intermediate electrode layer 122 and the data storage element DS and may provide a single sidewall spacer 150".

The interlayer insulating layer 160 of the present embodiment may include a first insulating layer 162 and a second insulating layer 165 on the first insulating layer 161 and filling a remaining space. In an implementation, the first insulating layer 162 may include a silicon nitride, and the second insulating layer 165 may include $SiO_2$ or SiOC.

Figure 18:
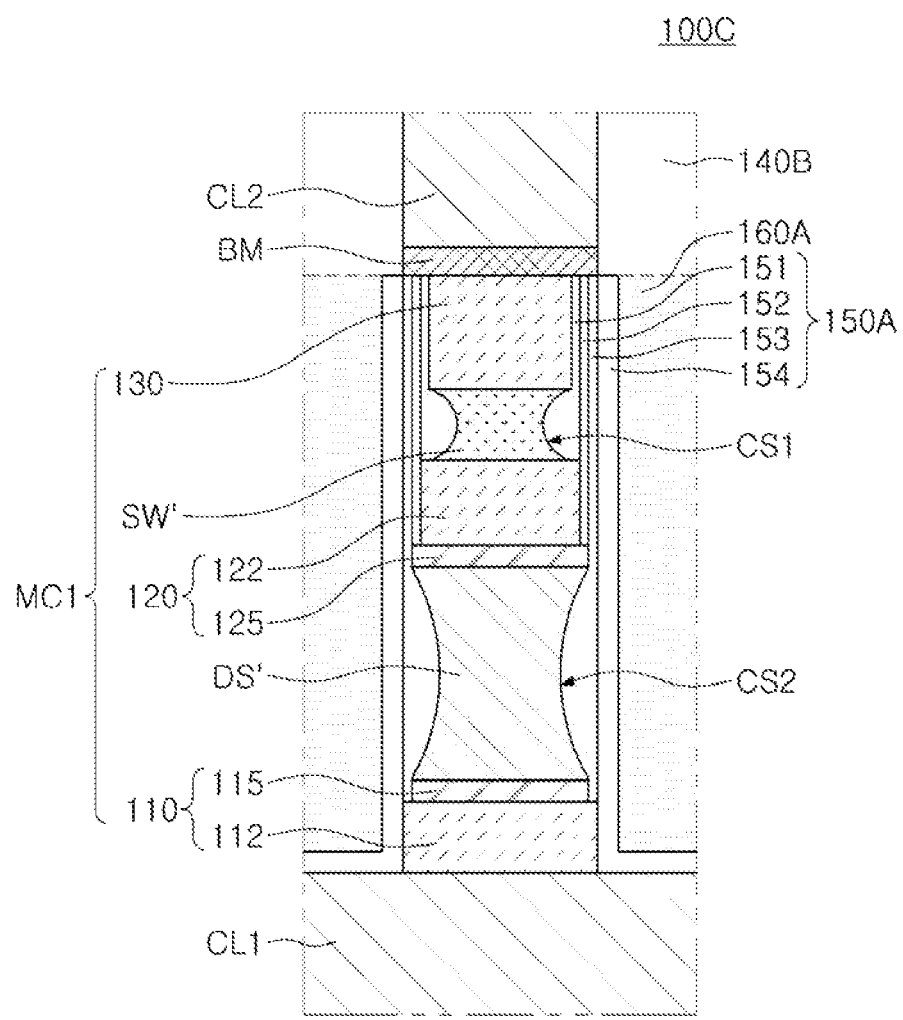
FIG. 18 is a cross-sectional view of a semiconductor memory device according to an example embodiment.

FIG. 18 is a cross-sectional view of a semiconductor memory device according to an exemplary embodiment.

A semiconductor memory device 100C according to the present embodiment may be understood as being similar to the semiconductor memory device 100 illustrated in FIGS.

1 to 3 except in having a concavely recessed side surface CS1 of a switching element SW and a data storage element DS similarly having a concave side surface CS2. Further, unless otherwise indicated, the semiconductor memory device 100C may be understood based on the same or similar elements of the semiconductor memory device 100 illustrated in FIGS. 1 to 3.

The switching element SW of the present embodiment may have the side surface CS1 concavely recessed and recessed further inwardly than a side surface of an upper electrode pattern 130. The data storage element DS may have a side surface CS2 recessed further inwardly than a first intermediate electrode layer 125. In the case of the sidewall spacer 150, a portion on the side surface CS1 of the switching element SW may have a greater thickness than a portion on a sides surface of the upper electrode pattern 130. In an implementation, a portion on the side surface CS2 of the data storage element DS may have a greater thickness than a portion on a side surface of the intermediate electrode pattern 120, e.g., the first intermediate electrode layer 125.

As the above, similarly to the switching element SW, the data storage element DS of the present embodiment may be effectively protected from contamination due to an electrode material (e.g., W) in subsequent patterning processes by applying an additional side surface etching process and reinforcing the sidewall spacer 150 in an etched region.

Figure 19:
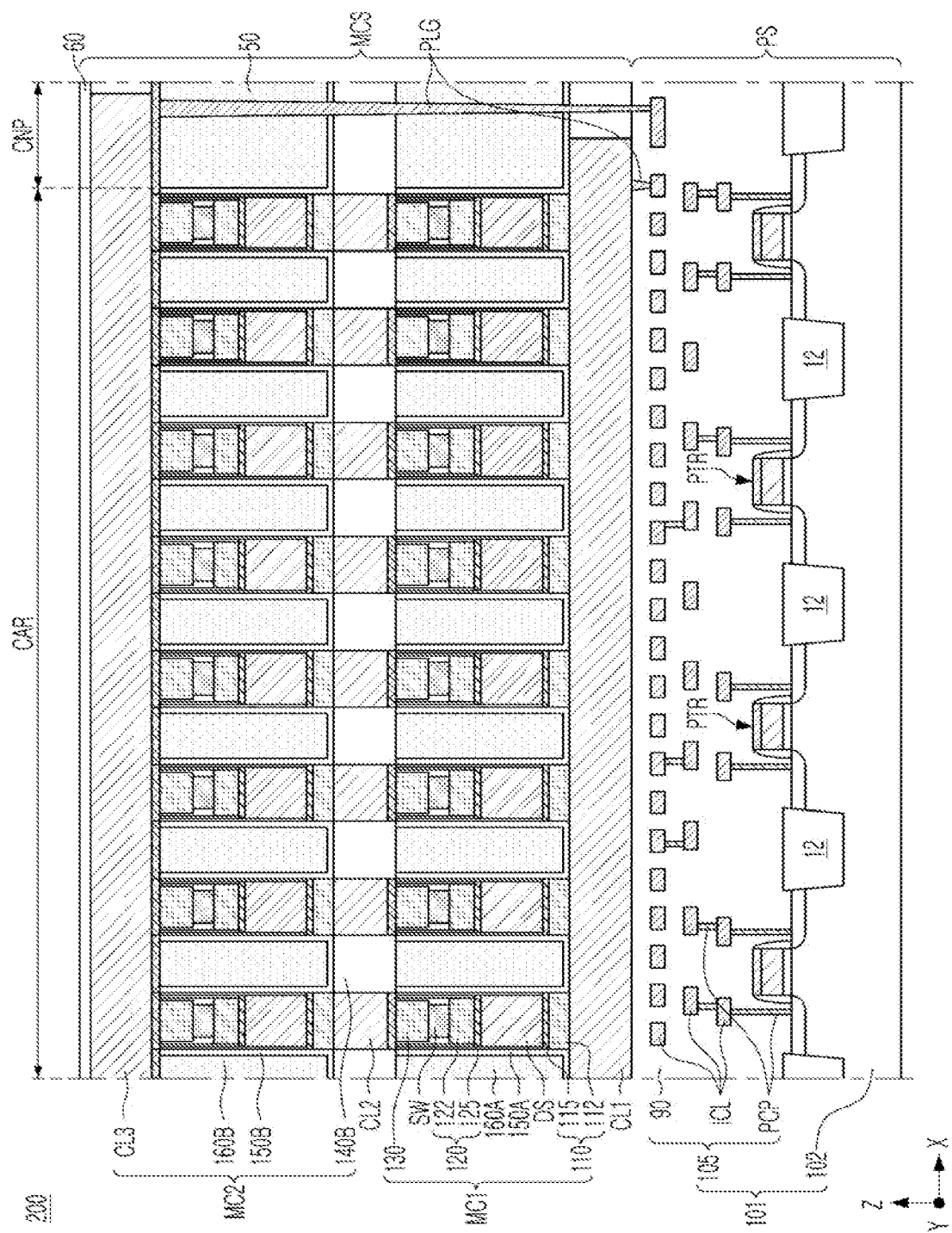
FIG. 19 is a cross-sectional view of a semiconductor memory device according to an example embodiment.

FIG. 19 is a cross-sectional view of a semiconductor memory device according to an exemplary embodiment.

Referring to FIG. 19, a semiconductor memory device 200 according to the present embodiment may include a peripheral logic structure PS and a memory cell stacked body MCS, and the memory cells tacked body MCS may be stacked on the peripheral logic structure PS.

The peripheral logic structure PS may include a semiconductor substrate 102 and a circuit region 105 implemented on the semiconductor substrate 102. The semiconductor substrate 102 and the circuit region 105 may be understood as elements corresponding to those of FIG. 2. The semiconductor substrate 102 may include active regions by device isolating film 12. The active region may include an n-well region doped with n-type impurities and a p-well region doped with p-type impurities.

The peripheral logic structure PS may include high voltage and low voltage transistors PTR, resistance and a capacitor. In an implementation, the peripheral logic structure PS may include transistors PTR having gate electrodes and source and drain regions, peripheral circuit plugs PCP, peripheral circuit wires ICL and a lower buried insulating layer 90 covering the peripheral circuit plugs PCP and the peripheral circuit wires ICL. The lower buried insulating layer 90 may cover the transistors PTR, the peripheral circuit plugs PCP, and the peripheral circuit wires ICL. The lower buried insulating layer 90 may include multilayer insulating layers.

The memory cells stacked body MCS may be on the lower buried insulating layer 90 and may be covered by an insulating protective layer. The memory cells stacked body MCS may be understood as a memory cells stacked body similar to the memory cells stacked body MCS described in FIG. 2. In an implementation, the memory cells stacked body MCS may include first to third conductive lines CL1 to CL3 and first and second memory cells MC1 and MC2 therebetween. The first and second memory cells MC1 and MC2 may include data storage element DS and a switching element SW. The first memory cells MC1 may include a lower electrode pattern 110 disposed between the first conductive lines CL1 and the data storage element DS, an intermediate electrode pattern 120 disposed between the data storage element DS and the switching element SW, and an upper electrode pattern 130 disposed between the switching element SW and the second conductive lines CL2. In an implementation, the second memory cells MC2 may include a lower electrode pattern 110 between the second conductive lines CL2 and the data storage element DS, the intermediate electrode pattern 120 between the data storage element DS and the switching element SW, and an upper electrode pattern 130 between the switching element SW and the third conductive lines CL3. Each element of the memory cell stacked body MCS may be understood based on the same elements illustrated in FIGS. 1 to 3.

The memory cell stacked body MCS may include a cell array region CAR and a connection region CNP closed disposed to the cell array region CAR. The memory cell stacked body MCS and the peripheral logic structure PS may be electrically connected to the connection region CNP. First to third conductive lines CL1 to CL2 of the memory cell stacked body MCS may extend to the connection region CNP. Similarly, first to third gap fill patterns 120A to 120C and first and second interlayer insulating layer 160A and 160B extend to the connection region CNP to provide a polished insulating layer 50. Contact plugs PLG passes through the polished insulating layer 50 to connect the first to third conductive lines CL1 to CL3 located in the connection region CNP and the peripheral circuit wires ICL of the peripheral logic structure PS.

In an implementation, as illustrated in FIG. 3, first and third conductive lines CL1 and CL3 may extend in the first direction (e.g., X direction) and contact plugs PLG may be connected thereto. In an implementation, the second conductive lines CL2 may extend similarly to be connected to the peripheral circuit lines ICL by the contact plug PLG on a cross-section in the second direction (e.g., Y direction).

The semiconductor memory device 200 according to the example embodiment may include the peripheral logic structure PS and the memory cell stacked body MCS overlapped in a planar view.

According to an embodiment, contamination due to an electrode material (e.g., W) may be effectively prevented in subsequent patterning processes by including a switching element (e.g., OTS) above a data storage element and reinforcing a sidewall spacer after etching a side surface of the switching element in a patterning process for a memory cell.

One or more embodiments may provide a semiconductor memory device including a data storage pattern.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:
1. A semiconductor memory device, comprising:
a substrate;

a first conductive line on the substrate and extending in a first direction, the first direction being parallel to an upper surface of the substrate;

a second conductive line extending in a second direction, the second direction intersecting the first direction;

a memory cell between the first and second conductive lines and including a lower electrode pattern, a data storage element, an intermediate electrode pattern, a switching element, and an upper electrode pattern sequentially stacked on the first conductive line; and a sidewall spacer on a side surface of the memory cell, wherein:

the side surface of the memory cell includes a first concave portion at a side surface of the switching element, and the sidewall spacer includes:
  a first portion on a side surface of the upper electrode pattern, and
  a second portion on the first concave portion, the second portion being thicker in the first direction than the first portion.

2. The semiconductor memory device as claimed in claim 1, wherein a depth of the first concave portion is 0.5 nm to 3 nm, as measured inwardly in the first direction from the side surface of the upper electrode pattern.

3. The semiconductor memory device as claimed in claim 1, wherein:
  the sidewall spacer further includes a third portion on a side surface of the lower electrode pattern, and
  the first portion of the sidewall spacer is thicker in the first direction than the third portion of the sidewall spacer.

4. The semiconductor memory device as claimed in claim 3, wherein:
  the sidewall spacer further includes a fourth portion on a side surface of the intermediate electrode pattern, and
  the fourth portion is thicker in the first direction than the third portion of the sidewall spacer and thinner in the first direction than the first portion of the sidewall spacer.

5. The semiconductor memory device as claimed in claim 1, wherein:
  an upper surface of the intermediate electrode pattern includes a perimeter area on which the switching element is not located, and
  the second portion of the sidewall spacer is on the perimeter area of the upper surface of the intermediate electrode pattern.

6. The semiconductor memory device as claimed in claim 5, wherein the intermediate electrode pattern includes:
  a first intermediate electrode layer on the data storage element, and
  a second intermediate electrode layer on the first intermediate electrode layer.

7. The semiconductor memory device as claimed in claim 6, wherein:
  an upper surface of the first intermediate electrode layer includes a perimeter area on which the second intermediate electrode layer is not located, and
  the sidewall spacer includes a portion on the perimeter area of the upper surface of the first intermediate electrode layer.

8. The semiconductor memory device as claimed in claim 6, wherein:
  the first intermediate electrode layer includes tungsten or a tungsten compound, and
  the second intermediate electrode layer includes a carbon-containing material.

9. The semiconductor memory device as claimed in claim 1, wherein the switching element includes an ovonic threshold switching device.

10. The semiconductor memory device as claimed in claim 1, wherein the lower electrode pattern includes:
  a first lower electrode layer on the first conductive line and including a carbon-containing material, and
  a second lower electrode layer on the first lower electrode layer and including tungsten or a tungsten compound.

11. The semiconductor memory device as claimed in claim 10, wherein:
  an upper surface of the first lower electrode layer includes a perimeter area on which the second lower electrode layer is not located, and
  the sidewall spacer includes a portion on the perimeter area of the upper surface of the first lower electrode layer.

12. The semiconductor memory device as claimed in claim 1, wherein the side surface of the memory cell further includes a second concave portion on a side surface of the data storage element.

13. The semiconductor memory device as claimed in claim 12, wherein the data storage element includes a phase-change material including:
  Te or Se, and
  Ge, Sb, Bi, Pb, Sn, As, S, Si, P, O, N, or In.

14. A semiconductor memory device, comprising:
  a substrate;
  first conductive lines spaced apart from each other on the substrate;
  second conductive lines extending across the first conductive lines and spaced apart from each other;
  memory cells between the first and second conductive lines;
  sidewall spacers on side surfaces of the memory cells; and
  an interlayer insulating layer filling a space between the memory cells,
  wherein:
  the memory cells include a lower electrode pattern, a data storage element, an intermediate electrode pattern, a switching element, and an upper electrode pattern sequentially stacked in a vertical direction perpendicular to an upper surface of the substrate,
  the upper electrode pattern has a first width in a horizontal direction parallel to the upper surface of the substrate,
  the switching element has a second width in the horizontal direction, the second width being smaller than the first width, and
  the sidewall spacer includes:
    a first portion on a side surface of the upper electrode pattern, and
    a second portion on the side surface of the switching element, the second portion being thicker in the horizontal direction than the first portion.

15. The semiconductor memory device as claimed in claim 14, wherein the sidewall spacer further includes:
  a third portion on a side surface of the lower electrode pattern, and
  a fourth portion on a side surface of the intermediate electrode pattern, the fourth portion being thinner in the horizontal direction than the first portion and being thicker in the horizontal direction than the third portion.

16. The semiconductor memory device as claimed in claim 15, wherein:
  the intermediate electrode pattern includes a first intermediate electrode layer on the data storage element and a second intermediate electrode layer on the first intermediate electrode layer, and a portion of the sidewall spacer on a side surface of the second intermediate electrode pattern is thicker in the horizontal direction than a portion of the sidewall spacer on a side surface of the first intermediate electrode layer.

17. The semiconductor memory device as claimed in claim 14, wherein a thickness of the second portion of the sidewall spacer in the horizontal direction is greater than a thickness of the first portion in the horizontal direction by 0.5 nm to 3 nm.

18. The semiconductor memory device as claimed in claim 14, wherein the switching element has a concave side surface.

19. The semiconductor memory device as claimed in claim 14, wherein the side surfaces of the memory cells include a concave portion in the data storage element.

20. A semiconductor memory device, comprising:
a substrate;
first conductive lines on the substrate and extending in a first direction, the first direction being parallel to an upper surface of the substrate;
second conductive lines extending in a second direction, the second direction intersecting the first direction;
memory cells between the first and second conductive lines and including a lower electrode pattern, a data storage element, an intermediate electrode pattern, a switching element, and an upper electrode pattern sequentially stacked on the first conductive lines; and
sidewall spacers on side surfaces of the memory cells, wherein:
the memory cells include a first concave side surface at the switching element and a second concave side surface at the data storage element, and
each of the sidewall spacers includes:
a first portion on the first concave side surface of the switching element, the first portion being thicker in a horizontal direction than a portion of the sidewall spacer on a side surface of the upper electrode pattern, and
a second portion on the second concave side surface of the data storage element, the second portion being thicker in the horizontal direction than a portion of the sidewall spacer on a side surface of the intermediate electrode pattern.

* * * * *